United States Patent [19]

Amorosi

[11] Patent Number: 4,987,676
[45] Date of Patent: Jan. 29, 1991

[54] END EFFECTOR FOR A ROBOTIC SYSTEM
[75] Inventor: Vincent G. Amorosi, Warminster, Pa.
[73] Assignee: Quad Systems Corporation, Horsham, Pa.
[21] Appl. No.: 397,403
[22] Filed: Aug. 23, 1989
[51] Int. Cl.⁵ .............................................. B23P 19/00
[52] U.S. Cl. ........................................ 29/740; 29/834; 901/40
[58] Field of Search ................... 294/2, 119.1; 29/740, 29/741, 834, 835, 836; 414/737; 901/40

[56] References Cited

U.S. PATENT DOCUMENTS

| | | | |
|---|---|---|---|
| 2,874,990 | 2/1959 | Janoff | 294/119.1 |
| 4,258,928 | 3/1981 | Weisler | 279/1 L |
| 4,372,802 | 2/1983 | Harigane et al. | 156/538 |
| 4,479,673 | 8/1984 | Inaba et al. | 294/88 |
| 4,515,507 | 5/1985 | Asai et al. | 29/740 |
| 4,599,037 | 7/1986 | Ross, Jr. et al. | 901/40 |
| 4,611,846 | 9/1986 | Feiber et al. | 294/88 |
| 4,650,237 | 3/1987 | Lessway | 294/119.1 |
| 4,727,647 | 3/1988 | Matson et al. | 294/119.1 |
| 4,753,004 | 6/1988 | Fujioka | 29/740 |
| 4,797,996 | 1/1989 | Lobry et al. | 29/740 |
| 4,802,816 | 2/1989 | Mezhinsky | 414/736 |
| 4,839,961 | 6/1989 | Vermeer | 29/740 |

FOREIGN PATENT DOCUMENTS 810477  3/1981  U.S.S.R. ............... 901/40

Primary Examiner—P. W. Echols
Attorney, Agent, or Firm—Woodcock Washburn Kurtz Mackiewicz & Norris

[57]  ABSTRACT

An end effector or centering chuck is disclosed having centering fingers which employ a linear sliding motion. A stepper motor is mounted on the centering chuck and controls the opening and closing of the centering fingers. The stepper motor is controlled such that the centering fingers decelerate as they approach the work to be centered. The X-axis fingers, for example, are moved into engagement with the work to be centered with the Y-axis fingers disengaged. After alignment in the X direction is achieved, the work is centered in the Y-axis direction with the Y fingers while the X fingers are disengaged.

20 Claims, 4 Drawing Sheets

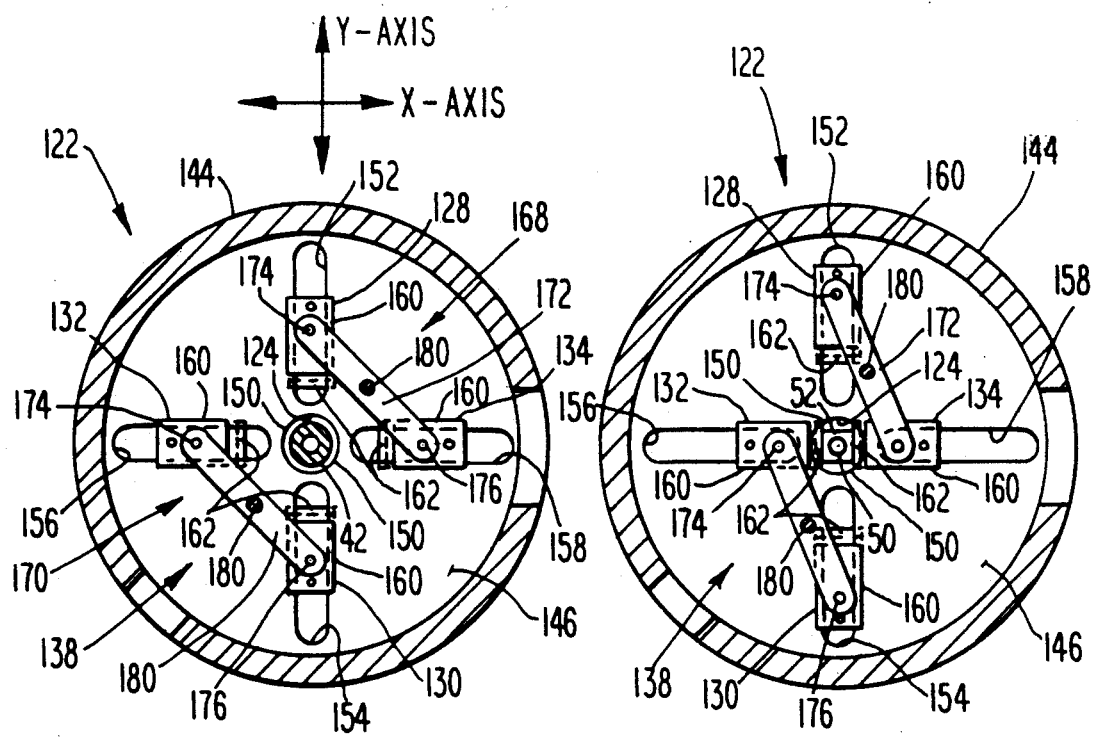
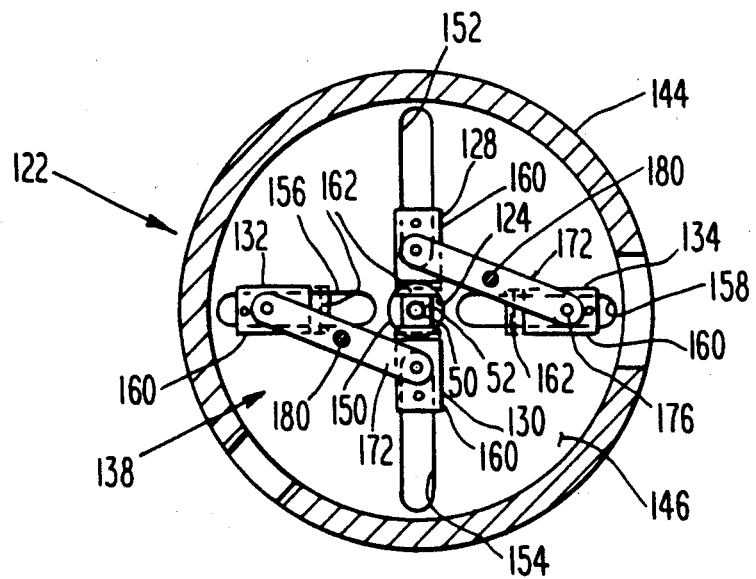

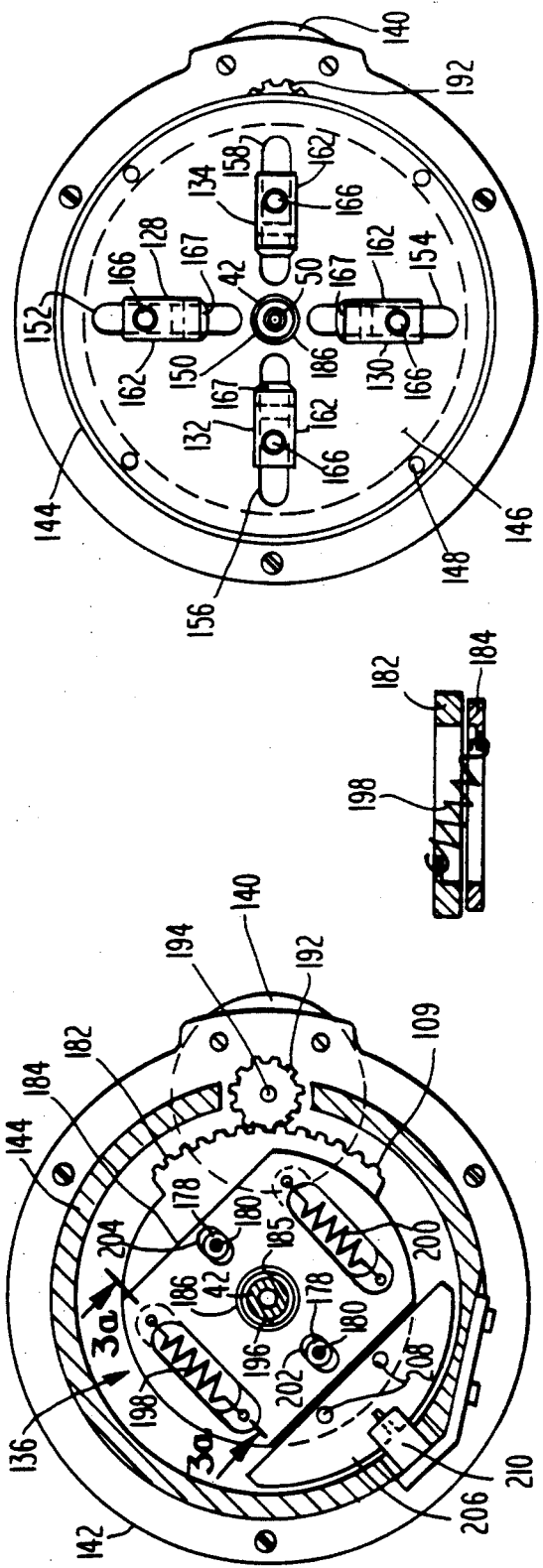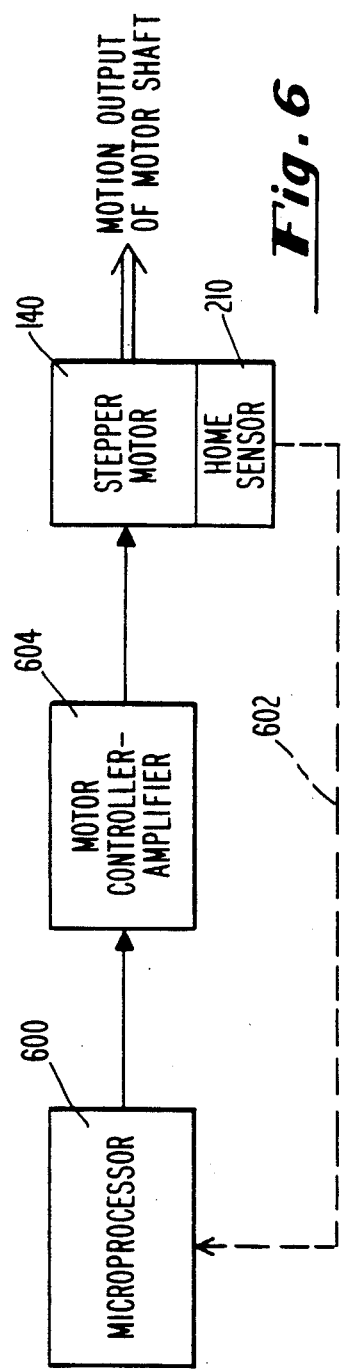

END EFFECTOR FOR A ROBOTIC SYSTEM

FIELD OF THE INVENTION

The present invention relates in general to the field of robotics, and in particular, relates to a novel and improved end effector or centering chuck for use with a robotic system.

BACKGROUND OF THE INVENTION

A robot, in modern parlance, comprises a general purpose manipulator, the movements of which are controlled by a 10 computer. In many cases, robots are designed to perform tasks in the past performed by humans. Thus, robots are required to perform gross movements, similar to those performed by the human arm, as well as precise movements similar to those performed by the human hand and fingers. In this regard, robotic systems typically employ a general purpose manipulator which includes two or more subsystems. The first of these subsystems may be termed a multi-axis manipulator. The second of these subsystems may be termed a head assembly which may include an end effector or centering head. It is an improved end effector or centering head to which the present invention is directed.

In a typical robotic system, the aforementioned multiaxis manipulator is utilized to provide gross movement control so as to generally position work or tool with respect to the workpiece. The head assembly is utilized to achieve precise movement control and to accurately position the work with respect to the workpiece.

While varying types of head assemblies are known, the type of head assembly to which the present invention is an improvement is required to provide linear movement, rotational movement and to provide simultaneous linear and rotational movement as well.

Such robotic systems have been found particularly suitable for the assembly of electronic equipment. It may be explained here that most electronic equipment includes electronic circuits formed by mounting various electrical components, such as resistors, capacitors, transistors, and integrated circuits, on a printed circuit board. The electrical components are mounted on the board with their terminals extending through holes in the board and connected to conductive paths on the surface of the board which connect the components in a desired circuit. Initially, such printed circuit board circuits were assembled by manually inserting the terminals of the components into the holes in the board. In order to increase the speed of assembling such printed circuit board circuits, robotic systems of the type here contemplated were developed which automatically inserted the components in the board.

One problem associated with prior art robotic systems which are used for electronic assembly purposes is that it is necessary that each component to be bonded to a given substrate be precisely aligned and positioned before bonding occurs. Different techniques have been employed to insure that the components to be assembled are properly aligned or oriented before bonding.

In one such technique, the components to be bonded are precisely aligned before being presented to the robotic system for assembly. For example, the components are sometimes precisely arranged on a carrier and the robotic system simply retrieves them from the carrier and thereafter bonds them to a substrate without changing the alignment or orientation of the components. This technique is relatively expensive, not only because it requires the presence of a carrier, but also because it requires the precise location of the various components with respect to that carrier.

In a second technique components are presented to the robotic system in a misaligned orientation rather than being aligned on a carrier. The robot selects a given component for assembly and thereafter transports that component to an alignment station at which the component is oriented. Thereafter the component is transferred to the substrate for assembly without change in orientation. This technique is unduly slow because it requires components to be directed to an additional work station, i.e., an alignment station rather than being directly applied to the substrate.

With a third technique, the disadvantages of the first two mentioned techniques are avoided. With the third technique components are presented to the robotic system with a misaligned orientation. The head assembly selects a given component and picks up that component with a pick-up means. With this technique, however, the head assembly is provided with an end effector, i.e., centering or alignment device, having fingers which not only grip but which also precisely align the selected component while the component is held by the pick-up means. The precisely aligned component is then bonded to the substrate without further change in its orientation. The head assembly of the robotic system which employs this third technique generally includes a hollow pick-up means or shaft through which a suction is drawn to engage and hold a component to the end of the pick-up means. Around the pick-up means are two pairs of fingers which are spaced ninety degrees apart, i.e., one pair of opposed fingers are utilized to align a component along the X-axis and the other pair are utilized to align the component along the Y-axis. The fingers are on the ends of arms which are pivoted adjacent their other ends so that the fingers can be swung along an arc toward and away from each other. When a component is picked up by the pick-up means, the fingers are swung together to center or align and engage the periphery of the component so that the component is grasped and held between the fingers.

A problem with this type of end effector or centering apparatus is that since the fingers move along an arc, they will engage different size components at different angles. Therefore, the fingers contact the component along what can be termed a line contact producing a very small contact area which results in deleterious stresses or pressures on the component. Also, such line contact can result in tilting of the components, particularly if the component is not of uniform size or shape, and poor positioning of the component with regard to the vacuum shaft. This can result in improper insertion of the component in the board.

A further problem is that the so-called X-axis fingers and Y-axis fingers are attempting to align or center the component simultaneously, e.g., the opposed pair of X-axis fingers engage the component to be centered and attempt to center the component while, at the same time, the opposed Y-axis fingers are in engagement with the component and are attempting to align the component. This results in a "tug-of-war" imposing unnecessarily high and undesirable forces on the component.

Also, the fingers are generally set or adjusted to handle the whole range of components which are expected to be encountered and the fingers are tailored to thinned down on at least one pair of opposed fingers to accommodate the whole range of components. On this latter point, for example, the opposed pair of X-axis fingers cannot engage the component if the Y-axis fingers are of the same size, i.e., have the same component engaging frontal area, as the X-axis fingers and the component is rectangular in shape. These two factors, i.e., setting the fingers to accommodate the range of expected components and the thinning down of the frontal engaging surfaces of one pair of opposed fingers, also result in undesirable forces being imposed on the components. Such forces, while only a few ounces, translate to thousands of pounds per square inch when small surface areas are involved as in centering chucks or end effectors of the type discussed above. These higher force may result in pressures on the components that cause internal defects, i.e., not visible, and cracks which can be seen. Such internal defects and cracks limit assembly reliability and result in low yields and generally, appear as electrical defects in the assembled electronic equipment.

Thus, there is a need to provide an end effector or centering chuck for use in a robotic system which does not suffer from these disadvantages and it is an object of this invention to provide such an end effector or centering chuck. It is a further object of this invention to provided an end effector or centering chuck which is capable of gripping, centering and locating components of varying size and shape with respect to a substrate without imposing unduly large forces on such components.

It is a still further object of the present invention to provide an end effector capable of the foregoing precise movements and which also grips or engages components with low impact force.

It is still a further object of the present invention to provide an end effector which has the benefit of low inertia due to its compact size and weight.

SUMMARY OF THE INVENTION

The present invention provides a centering chuck or an end effector for use in a robotic system in response to, and in satisfaction of, the aforementioned need. Briefly, and in accordance with the invention, there is provided a centering chuck for centering work on pick-up means of an assembly apparatus. The chuck includes a housing having an opening therethrough defining a bore having a longitudinal axis. First and second pairs of opposed centering fingers are supported by the housing. Each pair of fingers are supported on the housing for reciprocal movement toward and away from each other and the axis of the bore along a plane perpendicular to the axis of the bore. Linkage means are coupled to each pair of fingers for effecting reciprocal movement of each pair of fingers toward and away from each other and the axis of the bore. Driving means are mounted on the housing and coupled to the linkage means for effecting movement of the linkage means thereby reciprocating each pair of fingers.

A more complete understanding of the invention will be had upon consideration of the ensuing specification, particularly when considered in light of the appended drawings, directed toward a particular embodiment of the invention.

BRIEF DESCRIPTION OF THE DRAWINGS

FIG. 3 is a view taken along the line 3–3 of FIG.

FIG. 3a is view taken along the line 3a–3a of FIG 3;

FIG. 4 is a view taken along the line 4–4 of FIG. 1 illustrating the X-axis and Y-axis fingers in the neutral position;

FIG. 4a is a view similar to FIG. 4 but showing the closure position of the X-axis fingers;

FIG. 4b is a view similar to FIG. 4 but showing the closure position of the Y-axis fingers;

FIG. 5 is a bottom view of the end effector or centering head of the invention.

FIG. 6 is a block diagram illustrating a motor control circuit in accordance with the invention.

DETAILED DESCRIPTION OF THE INVENTION

Figure 1:
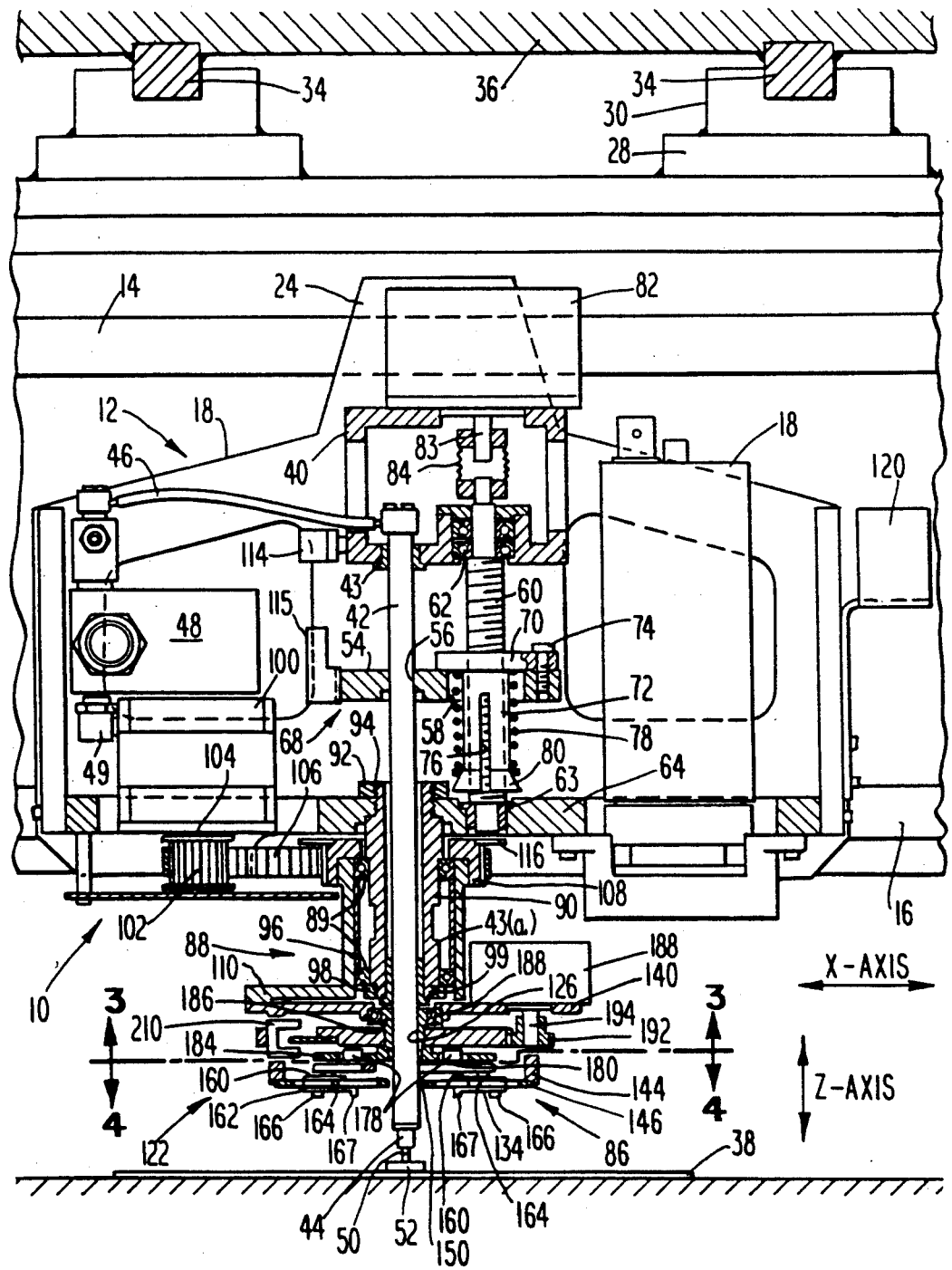
FIG. 1 is a sectional front view illustrating a head assembly mounted on the carriage of a robotic system, the head assembly having the end effector or centering chuck in accordance with the invention mounted thereon.
Figure 2:
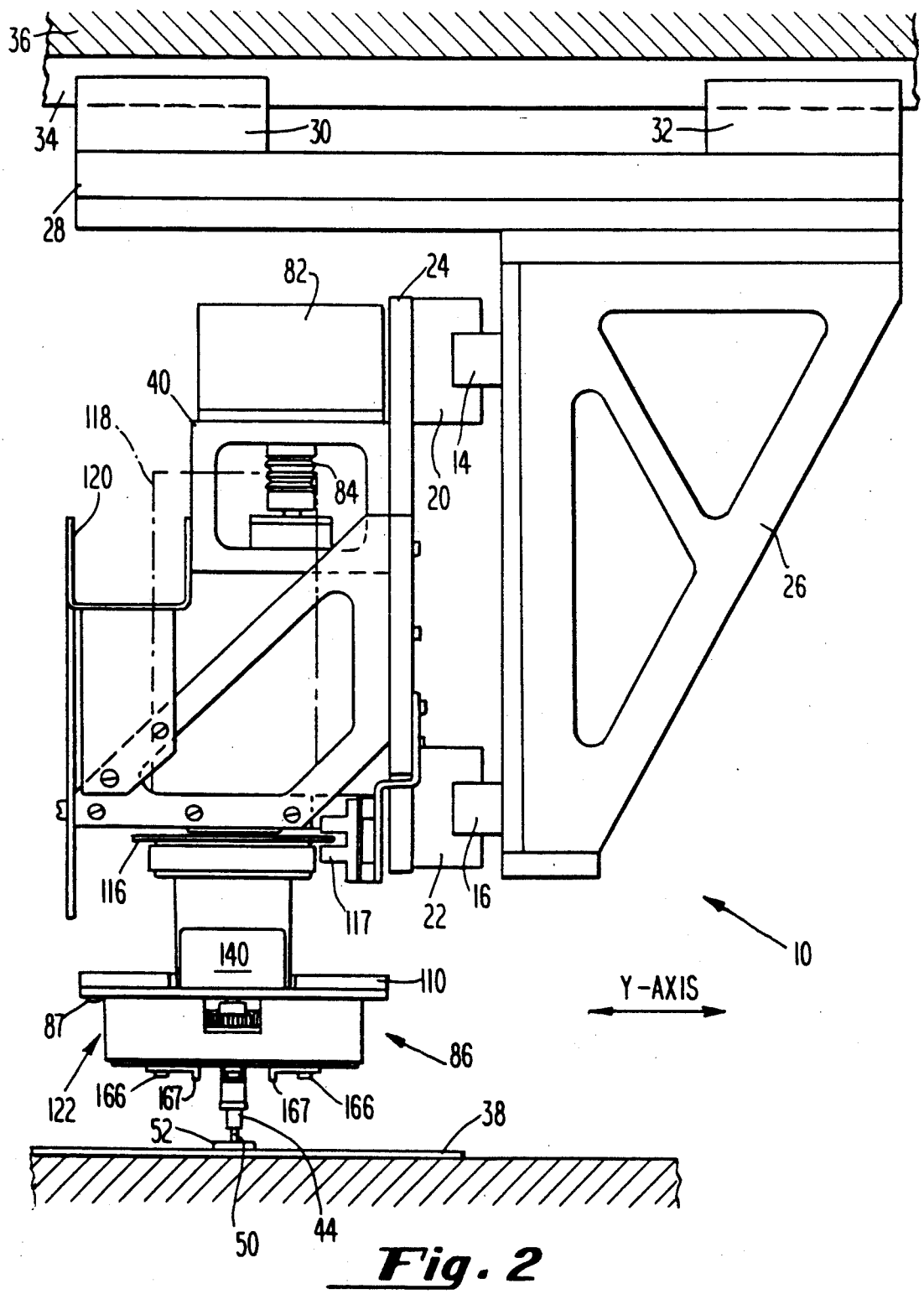
FIG. 2 is a right side view of FIG. 1

Referring now to FIGS. 1 and 2, a robotic system is partially shown generally at 10. The robotic system 10 includes a multi-axis manipulator which grossly positions the head assembly shown generally at 12.

The multi-axis manipulator as shown in FIGS. 1 and 2 includes a pair of spaced apart parallel rails 14 and 16 on which a carriage 18 is mounted for sliding movement in the X-axis direction via guide bearing blocks 20 and 22 (FIG. 2) which, in turn, are mounted on carriage back frame member 24. The head assembly 12 is mounted on the carriage 18 for movement therewith. The rails 14 and 16 are mounted on frame member 26, which, in turn, is mounted on frame member 28. Frame members 26 and 28 are mounted for sliding movement in the Y-axis direction via guide bearing blocks 30 and 32 which, in turn, are mounted on rails 34. Rails 34 are fixedly mounted to the over-all frame (not shown) of the apparatus as designated by the lines 36. Only a portion of the multi-axis manipulator has been illustrated but it will be understood by those skilled in the art that, various motors (not shown) and linkages and/or coupling means (not shown) can be utilized to grossly position or locate the carriage 18 and head assembly 12 supported thereon with respect to a workpiece 38 in both the X and Y direction. It will be further understood that once the carriage 18 and head assembly 12 are grossly positioned with respect to the workpiece 38, the precise movements performed by the head assembly 12 may be accomplished.

Referring now more particularly to FIG. 1, the head assembly 12 will now be described. The head assembly 12 includes a stationary portion 40 which is fixedly secured to the carriage 18 and a shaft 42 which is movable along the Z-axis direction with respect to top guide bushing 43 and bottom guide bushing 43(a) and thus to the stationary portion 40. The shaft 42 is preferably a hollow shaft with a pick-up tool 44 secured thereto. The hollow shaft 42 is coupled at the opposite end thereof with a flexible hose 46 which, in turn, is connected via solenoid valve 48 and pneumatic fitting 49 to a vacuum source (not shown). The tube 44 at its opposite end is fitted with a nozzle 50. Thus, the shaft 42 and its associated ports comprise a pick-up means which may be used to transport components, such as shown at 52, for assembly which remain attached to it by a vacuum.

The shaft 42 has an annular disk or drive bracket 54 secured thereto intermediate it ends as by a split clamp (not shown). The drive bracket 54 has two openings therethrough 56 15 and 58. Shaft 42 passes through opening 66 and a lead screw or threaded shaft 60 passes through the other opening 58. One end of the threaded shaft 60 is journaled for rotation by bearings 62 with respect to stationary portion 40 and the other end of shaft 60 is journaled for rotation by bushing 63 mounted in the base plate 64 of carriage 18. Mounted on lead screw 60 is a lead screw nut generally shown at 68 which is comprised of upper portion 70 and lower portion 72. The upper portion 70 of nut 68 is secured to drive bracket 54 by screws 74, only one of which can be seen in FIG. 1. The lower portion 72 of nut 68 depending from upper portion 70 is internally threaded and has an elongated slot 76 therein. Two more circumferentially spaced elongated slots are provided in lower portion 72, however, they cannot be seen in FIG. 1. Surrounding lower portion 72 is a coil spring 78 which provides a biasing force against the conical section so of lower portion 72 urging the internal threads of lower portion 72 against the threads of the lead screw thereby providing an anti-backlash action.

Mounted atop the stationary portion 40 is a rotary stepper motor 82 having a shaft 83 which is coupled to shaft 60 by means of a flexible shaft coupler 84. As will be understood, rotation of motor shaft 82 will effect rotation of head screw 60 which, in turn, will cause axial translation of lead screw nut 68 with respect to lead screw 60. Since nut 68 is secured to drive bracket 54 which, in turn, is secured to shaft 42, rotation of lead screw 60 will effect axial translation of shaft 42 in the Z-axis direction with respect to stationary portion 40 and carriage 18.

The head assembly 12 further includes a centering chuck or end effector shown generally at 86 which is detachably secured by means of screws 87 to a drive hub shown generally at 88. The drive hub 88 is journaled for rotation by upper and lower bearings 89 about a spindle tube 90. The spindle tube 90 is retained on base plate 64 of carriage 18 via nut 92 which is threadably received on the threads 94 provided on the upper end of spindle tube 90. A bearing spacer in the form of a cylindrical tube 96 is provided between upper and lower bearings 89 and a bearing retainer nut 98 is threadly received on the threads 99 provided on the lower end of spindle tube 90.

Also mounted on the carriage 18 is a rotary stepper motor 100 having a pulley 102 mounted on its shaft 104. The pulley 102 is coupled via a drive belt 106 to a driven pulley 108 non-rotably secured to the drive hub 88. The drive hub 88 is thus rotable with driven pulley 108 which is driven via belt 106 upon rotation of rotary stepper motor 100. The centering chuck or end effector 86 is secured to the annular flange 110 on drive hub 88 by means of the screws 87 and is rotatable therewith. Therefore, the centering chuck 86 may be rotated about the longitudinal axis of the shaft 42.

In addition to the components already described, the head assembly 12 further includes a Z-axis home sensor 114 and a Z-axis sensor flag 115 which are used to sense the vertical position of the shaft 42. As shown in FIG. 1, the shaft 42 is shown in its extreme downward position Also, mounted on the pulley 108 is an annular disk 116 which is used as a sensor flag for a sensor 117 which senses the rotational position of the chuck centering head 86. In addition to the head assembly 12 there is also mounted on the carriage 18 a solid state camera 118 and a cable carrier bracket 120.

Referring now to the bottom portion of the head assembly 12 and to the end effector or chuck centering head 86 mounted thereon, and with further reference to FIGS. 1, 2, 3, 3a, 4, 4a, 4b and 5, the end effector or centering chuck 86 will now be described in detail. The centering chuck 86 comprises an annular housing shown generally at 122 having a central opening therethrough 124 which defines a bore 126 having a longitudinal axis. The pick-up means or shaft 42 extends through the bore 126. As best seen in FIG. 5, a first pair of opposed centering fingers 128 and 130, respectively, are supported by the housing 122 on opposite sides of the pick-up means 42. A second pair of opposed centering fingers 132 and 134, respectively, circumferentially spaced from the first pair 128, 130, are also supported by the housing 122 on opposite sides of the pick-up means 42. As will become evident hereinafter, each pair of opposed centering fingers are supported on the housing 122 for sliding or reciprocal movement toward and away from each other and the axis of the bore 126 along a plane perpendicular to the axis of the bore 126.

As best seen in FIGS. 3 and 4 and as will be described in detail below, a portion of the linkage means in accordance with the invention is shown generally at 136 in FIG. 3 and another portion of the linkage means is shown generally at 138 in FIG. 4. As will be explained more fully hereinafter, the linkage means is coupled to each pair of fingers of the opposed first and second pairs of opposed centering fingers 128, 130 and 132, 134, respectively, for effecting reciprocal movement of each pair of fingers toward and away from each other and the axis of the bore 126.

As best seen in FIGS. 1 and 2, a driving means or rotary stepper motor 140 is mounted on the housing 122. As will be explained more fully hereinafter. The stepper motor 140 is coupled to the linkage means for effecting movement of the linkage means thereby reciprocating each pair of fingers.

Referring again to the housing 122, housing 122 comprises a cup shaped member defined by upper end wall 142, on which motor 140 is mounted, and depending cylindrical portion 144, and end plate 146. End plate 146 is secured to cylindrical portion 144 as by screws 148 and upper end wall 142 is secured to the annular flange 110 on drive hub 88, as described above. The end plate 146 has a central opening 150 concentric with the bore 126, and a first pair of guide slots 152 and 154, respectively, which are located on diagonally opposite sides of the central opening 150. The end plate 146 also has a second pair of guide slots 156 and 158, respectively, which are located on diagonally opposite sides of the central opening 150 and which are spaced 90 apart circumferentially around the central opening 150 from the first pair of guide slots 152, 154.

Each of the fingers 128, 130, 132 and 134 is comprised of an upper rectangular plate 160 and a lower rectangular plate 162. The upper and lower plates 160, 162 respectively, are sized to be slightly wider than the guide slots 152-158. The upper plate 160 further includes a depending portion 164 which is sized to be slidably received in the guide slots 152-158. The lower plate 162 is secured as by screws 166 to depending portion 164 of upper plate 160. The arrangement is such that each finger substantially comprises an I in cross section with the vertical portion of the I being approximately equal in width to the width of the guide slots and with the horizontal portions of the I overlapping the edges of the guide slots. There is thus provided opposite pairs of opposed centering fingers 128, 130, 132, 134 which are slidably mounted in the opposite pairs of guide slots 152, 154, 156, 158, respectively It will also be noted the each lower plate 162 includes a depending portion 167 which in operation actually engages the work or electronic component 52. The depending portion 167 is substantially rectangular in shape and each depending portion of each finger 128-134 is substantially equal in frontal area, i.e., the frontal portion of each finger which engages the work or electronic components is equal in size. As will become evident hereinafter this is possible because of the manner in which fingers 128-134 are operated.

Referring now more particularly to FIGS. 4, 4a and 4b, that portion of the linkage means shown in these three figures comprises a first link arm shown generally at 168 and a second link arm shown generally at 170. Each link arm is substantially identical to the other and each comprises an elongated arm portion 172 which has a depending pin 174 at one end thereof and a like depending pin 176 at the other end thereof. Intermediate the ends of each link arm 168, 170 is an upstanding pin means comprised of a roller 178 and an upstanding pin 180 which is provided in the center of each arm portion 172.

The first link arm 168 is pivotally connected at one end thereof to the finger 128 via its depending pin 174 which is received in a complementary opening in the upper surface of upper plate 160 of the finger 128 and first link arm 168 is pivotally connected at the other end thereof to the finger 134 via its depending pin 176 which is received in a complementary opening in the upper surface of upper plate 160 of the finger 134.

The second link arm 170 is pivotally connected at one end thereof to the finger 132 via its depending pin 174 which is received in a complementary opening in the upper surface of upper plate 160 of the finger 132 and second link arm 170 is pivotally connected at the other end thereof to the finger 130 via its depending pin 176 which is received in a complementary opening in the upper surface of upper plate 160 of the finger 130.

Referring now more particularly to FIGS. 3 and 3a, the other portion of the linkage means shown in these two figures comprises a first member or sector gear 182 and a roller or pin engagement means or spring plate 184. The sector gear 182 has an opening 185 therethrough which is concentric to the bore 126 in the housing 122 and the gear 182 is fixed to hub 186 (see FIG. 1). The hub 186 is journaled for rotation in housing 122 by bearing 188 which is disposed in upper end wall 142. The teeth 190 of sector gear 182 mesh with a motor gear 192 mounted on the shaft 194 of stepper motor 140.

The pin engagement means or spring plate 184 also has a central opening 196 therethrough which is concentric to the bore 126. The hub 186 extends into the opening 196, however, the spring plate 184 is not secured to the hub 186, but rather is free to rotate around the hub 186. The spring plate 184 is, however, secured to the first member or sector gear 182 by means of a pair of springs 198 and 200, respectively. Thus, the spring plate 184 is coupled to the first member 182 for limited relative movement with respect to the first member 182 because the spring plate is free to rotate about the hub 186, i.e., free to rotate to the extent permitted by the opposing action of the springs 198 and 200 with the spring 200 limiting counterclockwise rotation and the spring 198 limiting clockwise rotation of the spring plate 184. The spring plate 184 also has a pair of openings 202 and 204, respectively, which are located on diagonally opposite sides of the central opening 196. The pins means, i.e., roller 178 and pin 180 of the link arms 168 and 170, are received in the openings 202 and 204. As will be explained more fully hereinafter the first member 182 and pin engagement means 184 together comprising a moving means for selectively moving the link arms 168 and 170 via rollers 178 in relatively opposite concentric arc directions so that the movement of the link arms cause movement of the fingers 128-134.

In addition to the components already described, end effector 86 further includes a sensor flag 206 mounted on sector gear 182 by screws 208 and a home sensor 210 which senses the position of the sector gear 182 and thus the home or neutral position of the fingers 128-134. FIGS. 4 and 5 illustrate the fingers 128-134 being in the home or neutral positions and FIG. 4a illustrates the closure position of the X-axis fingers and FIG. 4b illustrates the closure position of the Y-axis fingers.

Having thus described the details of construction, a brief description of a cycle of the operation of the robotics system and the centering chuck or end effector forming a part thereof in accordance with the invention will now be described. It is to be understood that the cycle of operation to be described is under computer control. In operation, carriage 18 is grossly positioned or located with respect to a workpiece 38 in both the X and Y direction. It should be noted that the workpiece shown in FIG. 1 at 38 may represent the location from which the work or component 52 is picked up or where it is placed. Assuming first that the workpiece 38 is the location of a supply of a component to be mounted on a printed circuit board, the motor 82 is operated to rotate lead screw 60 in the direction to move nut 68, and thereby shaft 42, downwardly in the Z-axis direction until the vacuum nozzle 50 engages the electrical component 52 as shown in FIG. 1. The vacuum drawn through the vacuum nozzle 50 causes the component 52 to adhere to the nozzle 50. The motor 82 is then rotated in the opposite direction to move shaft 42 upwardly in the Z-axis direction until the component 52 is at the same elevation as the fingers 128-134, i.e., the same horizontal plane of the fingers 128-134.

When the component 52 is at the same elevation as the fingers 128-134, the rotary stepper motor 140 is then rotated in a first direction, e.g. clockwise, effecting movement of the first pair of fingers 128, 130 in the Y-axis direction away from their neutral position shown in FIG. 4 into engagement with the component 52 (see FIG. 4b) thereby centering the component 52 in the Y-axis direction. It should be noted that clockwise rotation of the stepper motor 140, causes motor gear 192 to rotate counterclockwise and sector gear 182 to rotate clockwise when viewed in FIG. 3. This, in turn, causes spring plate 184 to rotate clockwise and thereby moving the link arms 168 and 170 in relatively opposite direction, i.e., roller 178 of arm 168 (see FIG. 4) will move down and to the right (along a circular first arc) of its position shown in FIG. 4 to the position shown in FIG. 4b and roller 178 of arm 170 will move up and to the left (along a circular arc concentric with the first arc) of its position shown in FIG. 4 to the position shown in FIG. 4b.

The movement of the roller 178 of arm 168 moving down and to the right of its position shown in FIG. 4 to the position shown in FIG. 4b will cause the end of link arm 168 with the pin 174 to move down, i.e., in the Y-axis direction, toward the axis of the bore 126, i.e., the center of opening 150, sliding the finger 128 toward the axis of the bore 126; it will also cause the end of link arm 168 with the pin 176 to move to the right, i.e., in the X-axis direction, away from the axis of bore 126 sliding the finger 134 away from the axis of the bore 126. Thus, when finger 128 is caused to move toward the axis of the bore 126, finger 134 is caused to move away from the axis of the bore 126.

The movement of the roller 178 of arm 170 moving up and to the left of its position shown in FIG. 4 to the position shown in FIG. 4b will cause the end of the link arm 170 with the pin 176 to move up, i.e., in the Y-axis direction, toward the axis of bore 126, i.e., the center of opening 150, sliding the finger 130 toward the axis of the bore 126; it will also cause the end of link arm 170 with the pin 174 to move to the left, i.e., in the X-axis direction, away from the axis of the bore 126 sliding the finger 132 away from the axis of the bore 126. Thus, when finger 130 is caused to move toward the axis of the bore 26, finger 132 is caused to move away from the axis of the bore 26.

From the foregoing it will be understood that rotation of the rotary stepper motor 140 in a first direction causes fingers 128 and 130 to move away from their neutral position (FIG. 4) and to move in the Y-axis direction toward each other and the axis of the bore 126 (FIG. 4b) and simultaneously causes finqers 132 and 134 to move away from their neutral position (FIG. 4) and to move in the X-axis direction away from each other and the axis of the bore 126 (FIG. 4b). This action thereby centers the component 52 on the nozzle 50 of the pick-up means in the Y-axis direction.

In order to center the component in the X-axis direction, the rotary stepper motor 140 is then rotated in a second direction, e.g., counterclockwise, effecting movement of the second pair of fingers 132, 134 in the X-axis direction away from the position shown in FIG. 4b into engagement with the component 52 (see FIG. 4a) while at the same time retracting the first pair of fingers 128, 130 from the component 52 thereby centering the component 52 in the X-axis direction.

Operation of the linkage means in effecting X-axis centering of the component 52 is similar but opposite to its operation in effecting Y-axis centering. It should be noted that counterclockwise rotation of the stepper motor 140 causes motor gear 192 to rotate clockwise and sector gear 182 to rotate counterclockwise when viewed in FIG. 3. This, in turn, causes spring plate 184 to rotate counterclockwise and thereby moving the link arms 168 and 170 in relatively opposite direction, i.e., roller 178 of arm 168 (see FIG. 4b) will move up and to the left (along a circular first arc) of its position shown in FIG. 4b to the position shown in FIG. 4a and roller 178 of arm 170 will move down and to the right of its (along a circular arc concentric with the first arc) position shown in FIG. 4b to the position shown in FIG. 4a.

The movement of the roller 178 of arm 168 moving up and to the left will cause the end of link arm 168 with the pin 174 to move up, i.e., in the Y-axis direction, away from the axis of the bore 126, i.e., the center of opening 150, sliding the finger 128 away from the axis of the bore 126; it will also cause the end of link arm 168 with t he pin 176 to move to the left, i.e., in the X-axis direction, toward the axis of bore 126 sliding the finger 134 toward the axis of the bore 126. Thus when finger 128 is caused to move away from the axis of the bore 126, finger 134 is caused to move toward the axis of the bore 126.

The movement of the roller 178 of arm 170 moving down and to the right of its position shown in FIG. 4b to the position shown in FIG. 4a will cause the end of the link arm 170 with the pin 176 to move down, i.e., in the Y-axis direction, away from the axis of bore 126, i.e., the center of opening 150, sliding the finger 130 away from the axis of the bore 126; it will also cause the end of link arm 170 with the pin 174 to move to the right, i.e., in the X-axis direction, toward the axis of the bore 126 sliding the finger 132 toward the axis of the bore 126. Thus, when finger 130 is caused to move away from the axis of the bore 126, finger 132 is caused to move toward the axis of the bore 126.

From the foregoing it will be understood that rotation of the rotary stepper motor 140 in the second direction causes fingers 128 and 130 to move away from their position shown in FIG. 4b and to move in the Y-axis direction away from each other and the axis of the bore 126 to the position shown in FIG. 4a and simultaneously causes fingers 132 and 134 to move away from their position shown in FIG. 4b and to move in the X-axis direction toward each other and the axis of the bore 126 to the position shown in FIG. 4a. This action thereby centers the component 52 on the nozzle 50 of the pick-up means in the X-axis direction.

Once the component is centered in both the X and Y axis directions, the stepper motor 140 is again rotated in the first direction, i.e., clockwise, effecting movement of the second pair of fingers 132, 134 away from engagement with the component 52. Of course, at this time, the rotation of the stepper motor 140 need only be such so as to retract the second pair of fingers 132, 134 without causing the first pair of fingers 128, 130 to move into engagement with the component 52.

With the component 52 now centered on the nozzle 50, the carriage Is can again be moved to position the component over the appropriate position on the printed circuit board 38. It should be noted that the centering action described above can be effected during the traverse of the carriage from the pick-up position to the placement position. If necessary, the component can be further positioned with respect to the printed circuit board by rotating the hub 88 by means of the motor 100 during the time in which one of the pairs of centering fingers are in contact with the component. The motor 82 is then rotated in the proper direction to move the pick-up means (shaft 42) downwardly in the Z-axis direction until the component 52 is mounted on the board 38. The vacuum on the nozzle 50 is then released so that head assembly 12 and carriage 18 can be moved to pick up another component to repeat the cycle.

Referring now again to the linkage means comprising link arms 168, 170; and moving means comprised of first member 182 and pin engagement means 184 and, to the springs 198 and 200 coupling the first member or sector gear 182 to the pin engagement means or spring plate 184, the purpose of the springs, in addition to coupling members 182 and 184, will now be explained. The springs 198, 200 permit the motor 140 to over drive an incremental step when a component is engaged prior to the stepper motor effecting a full step In such a case the springs will compress and provide an assured grip on the component. Also, the springs 198, 200 permit various larger component sizes to be handled with a predetermined chuck motor 140 actuation. And further, the springs 198, 200 decouple the rotary mass of the chuck sector gear and chuck motor assembly from being seen by the component in terms of impacting momentum.

Referring now to FIG. 6, there is shown a block diagram illustrating a motor control circuit in accordance with the invention. The preferred embodiment comprises the stepper motor 140 and home sensor 210 which may take the form of a position encoder. Home sensor 210 senses the position of the stepper motor 140 and communicates positional data back to a microprocessor 600 as indicated by the dashed line 602. In the preferred embodiment, the positional data comprises a count of the steps taken by the stepper motor 140 between data samples of the home sensor 210. Alternatively, however, the positional data could just as well represent the velocity (number of steps divided by time between samples) of the stepper motor 140.

The microprocessor 600 controls the stepper motor 140 in accordance with initial or operator set-up data and preprogrammed velocity and position profiles For example, voltage pulses of a fixed amplitude and variable pulse width and pulse repetition frequency (PRF) are sent to a motor controller amplifier 604 that powers the stepper motor 140. The speed of the stepper motor 140, being dependent upon and proportional to the average voltage, is thus proportional to the width and PRF of the voltage pulses. In accordance with an important aspect of the invention, when the position of the stepper motor, as indicated by the home sensor 210, reaches a predetermined value (depending on the physical dimensions of the work or electronic component) the pulse width and/or PRF is decreased at a predefined rate so that the stepper motor 140 decelerates to a low approach velocity at the time in which the centering fingers contact (and center) the work on the vacuum pick-up means. Once contact is made, the centering fingers come to rest on the work while the motor 140 provides a small additional amount of rotation to load the spring plate 184 ensuring a predetermined value of squeeze on the work or component. The overall effect of this action is that each pair of opposed fingers will engage work attached to the pick-up means with low impact force thereby avoiding the higher forces imposed by prior art end effectors when their centering fingers make contact with such work or component.

From the preceding description of a preferred embodiment, it is evident that the objects of the invention are attained. Although the particular embodiment of the centering chuck of the present invention and the robotic system with which it is used have been shown and described, it will, of course be understood that various modifications may be made without departing from the principles of the invention. The appended claims are, therefore, intended to cover any such modifications within the true spirit and scope of the invention.

What is claimed:

1. A centering chuck for centering work on pick-up means of an assembly apparatus which comprises:
   (a) a housing having an opening therethrough defining a bore having a longitudinal axis;
   (b) first and second pairs of opposed centering fingers supported by said housing, each pair of fingers of said first and second pairs of opposed centering fingers being supported on said housing for reciprocal movement toward and away from each other and the axis of said bore along a plane perpendicular to the axis of said bore;
   (c) linkage means coupled to each pair of fingers of said first and second pairs of opposed centering fingers for effecting reciprocal movement of each pair of fingers of said first and second pairs of opposed centering fingers toward and away from each other and the axis of said bore; and
   (d) driving means mounted on said housing and coupled to said linkage means for effecting movement of said linkage means thereby reciprocating each pair of fingers of said first and second pairs of opposed centering fingers.

2. A centering chuck according to claim 1 wherein said driving means comprises:
   (a) a rotary stepper motor for alternately reciprocating each pair of fingers through said linkage means with controlled deceleration as each finger of each pair of opposed fingers approach each other and the axis of said bore so that each pair of opposed fingers will engage work attached to pick-up means located in said bore with low impact force.

3. A centering chuck according to claim 1 wherein said housing includes an end plate, said end plate having a central opening concentric with said bore and first and second pairs of guide slots;
   (a) said first pair of guide slots being located on diagonally opposite sides of said central opening;
   (b) said second pair of guide slots being located on diagonally opposite sides of said central opening and spaced circumferentially around said central opening from said first pair of guide slots; and wherein
   (c) one finger of said first pair of opposed centering fingers is slidably mounted in one of said first pair of guide slots and the other finger of said first pair of opposed centering fingers is slidably mounted in the other of said first pair of guide slots; and
   (d) one finger of said second pair of opposed centering fingers is slidably mounted in one of said second pair of guide slots and the other finger of said second pair of opposed centering fingers is slidably mounted in the other of said second pair of guide slots 4. A centering chuck according to claim 3 wherein said linkage means comprises;
   (a) a first link arm, said first link arm being pivotally connected at one end thereof to said one finger of said first pair of opposed centering fingers and pivotally connected at the other end thereof to said other finger of said second pair of opposed centering fingers;
   (b) a second link arm, said second link arm being pivotally connected at one end thereof to said one finger of said second pair of opposed centering fingers and pivotally connected at the other end thereof to said other finger of said first pair of opposed centering fingers; and,
   (c) moving means coupled to each of said first link arm and said second link arm for selectively moving said first and second link arms in relatively opposite directions so that the movement of said link arms by said moving means in a first direction will cause said first pair of opposed centering fingers to move toward and away from each other and the axis of said bore, and so that movement of said link arms by said moving means in a second direction opposite to said first direction will cause said second pair of opposed centering fingers to move toward and away form each other and the axis of said bore.

5. A centering chuck according to claim 4 wherein said driving means comprises a rotary stepper motor and rotation of said rotary stepper motor in a first rotary direction effects movement of said first pair of opposed centering fingers toward each other and the axis of said bore and simultaneous movement of said second pair of opposed centering fingers away from each other and the axis of said bore.

6. A centering chuck according to claim 5 wherein rotation of said rotary stepper motor in the reverse rotary direction to said first rotary direction effects movement of said first pair of opposed centering fingers away from each other and the axis of said bore and simultaneous movement of said second pair of opposed centering fingers toward each other and the axis of said bore.

7. A centering chuck according to claim 6 wherein said first and second link arms each have pin means extending therefrom intermediate their respective ends, and said moving means comprises:
  (a) a first member supported for rotary movement by said housing, said first member having teeth along a peripheral portion thereof; and
  (b) pin engagement means coupled to said first member and engageable with each of said pin means; a gear having teeth mating with the teeth on said first member, said rotary stepper motor coupled to said gear to rotate the gear and said first member.

8. A centering chuck according to claim 7 wherein said pin engagement means comprises;
  (a) a second member coupled to said first member for limited relative movement with respect to said first member, said second member having a pair of openings therein into which the pin means of said first and second link arms are received.

9. A centering chuck according to claim 8 wherein said first member is coupled to said second member by spring means.

10. In a robotics system having a multi-axis manipulator for grossly positioning work with respect to a workpiece and a head assembly for precisely positioning said work with respect to that workpiece, said head assembly comprising;
  (a) a pick-up means for engaging work and holding said work thereon; and
  (b) centering means located adjacent to said pick-up means for centering work held on said pick-up means in a first direction and i a second direction, said centering means comprising; 5 (c) a housing having an opening therethrough through which said pick-up means extends;
  (d) a first pair of opposed centering fingers on opposite sides of said pick-up means;
  (e) a second pair of opposed centering fingers on opposite sides of said pick-up means and spaced from said first pair of centering fingers; each pair of fingers of said first and second pairs of centering fingers being supported by said housing for movement toward and away from each other along a plane substantially perpendicular to the axis of said pick-up means;
  (f) linkage means coupled to said first and second pairs of centering fingers for both
    (i) effecting movement of said first pair of centering fingers toward and into engagement with work held on said pick-up means to center said work on said pick-up means in said first direction and thereafter, retract said first pair of centering fingers away from said work after said work is centered on said pick-up means in said first direction; and
    (ii) effecting movement of said second pair of centering fingers toward and into engagement with work held on said pick-up means to center said work on said pick-up means in said second direction and thereafter, retract said second pair of centering fingers from said work after said work is centered on said pick-up means in said second direction;
  (g) driving means mounted on said housing and coupled to said linkage means for effecting movement of said first and second pairs of centering fingers through said linkage means.

11. In a robotics system according to claim 10 wherein said driving means comprises;
  (a) a rotary stepper motor for alternately moving said first and second pairs of centering fingers through said linkage means with controlled deceleration as each finger of each pair of fingers of said first and second pairs of centering fingers approach work held on said pick-up means so that each pair of centering fingers will engage work attached to said pickup means with low impact force.

12. In a robotics system according to claim 10 wherein said housing includes an end plate, said end plate having a central opening concentric with the opening in said housing and first and second pairs of guide slots;
  (a) said first pair of guide slots being located on diagonally opposite sides of said central opening; 15 (b) said second pair of guide slots being located on diagonally opposite sides of said central opening and spaced circumferentially around said central opening from said firs pair of guide slots, and wherein
  (c) one finger of said first pair of opposed centering fingers is slidably mounted in one of said first pair of guide slots and the other finger of said first pair of opposed centering fingers is slidably mounted in the other of said first pair of guide slots; and
  (d) one finger of said second pair of opposed centering fingers is slidably mounted in one of said second pair of guide slots and the other finger of said second pair o opposed centering fingers is slidably mounted in the other of said second pair of guide slots.

13. In a robotics system according to claim 12 wherein said linkage means comprises;
  (a) a first link arm, said first link arm being pivotally connected at one end thereof to said one finger of said first pair of opposed centering fingers and pivotally connected at the other end thereof to said other finger of said second pair of opposed centering fingers;
  (b) a second link arm, said second link are being pivotally connected at one end thereof to said one finger of said second pair of opposed centering fingers and pivotally connected at the other end thereof to said other finger of said first pair of opposed centering fingers; and
  (c) moving means coupled to each of said first link arm and said second link arm for selectively moving said first and second link arms in relatively opposite directions so that the movement of said link arms by said moving means in a first direction will cause said first pair of opposed centering fingers to move toward and away from each other and the axis of said bore, and so that movement of said link arms by said moving means in a second direction opposite to said first direction will cause said second pair of opposed centering fingers to move toward and away form each other and the axis of said bore.

14. In a robotics system according to claim 13 wherein said driving means comprises a rotary stepper motor and rotation of said rotary stepper motor in a first rotary direction effects movement of said first pair of opposed centering fingers toward each other and the axis of said bore and simultaneous movement of said second pair of opposed centering fingers away from each other and the axis of said bore.

15. In a robotics system according to claim 14 wherein rotation of said rotary stepper motor in the reverse rotary direction to said first rotary direction effects movement of said first pair of opposed centering fingers away from each other and the axis of said bore and simultaneous movement of said second pair of opposed centering fingers toward each other and the axis of said bore.

16. In a robotics system according to claim 15 wherein said first and second link arms each have pin means extending therefrom intermediate their respective ends, and said moving means comprises:
    (a) a first member supported for rotary movement by said housing, said first member having teeth along a peripheral portion thereof;
    (b) pin engagement means coupled to said first member and engageable with each of said pin means; a gear having teeth mating with the teeth on said first member, said rotary stepper motor coupled to said gear to rotate the gear and said first member.

17. In a robotics system according to claim 16 wherein said pin engagement means comprises;
    (a) a second member coupled to said first member for limited relative movement with respect to said first member, said second member having a pair of recesses therein into which the pin means of said first and second link arms are received.

18. In a robotics system according to claim 17 wherein said first member is coupled to said second member by spring means.

19. A robotics system for assembling a plurality of circuit components with respect to a substrate comprising;
    (a) a carriage for grossly positioning said components with respect to said substrate;
    (b) a head assembly mounted on said carriage for precisely positioning said components with respect to said substrate, said head assembly including;
        (i) a stationary portion fixed to said carriage;
        (ii) a pick-up means movable along its axis with respect to said stationary portion, said pick-up means having a nozzle for holding circuit components adjacent thereto by means of a vacuum; and
        (iii) centering means for centering circuit components with respect to said nozzle in a first direction and in a second direction, said centering means comprising;
    (c) a housing having an opening therethrough through which said pick-up means extends;
    (d) first and second pairs of opposed centering fingers supported by said housing, each pair of fingers being supported by said housing for sliding movement toward and away from each other along a plane substantially perpendicular to the axis of said opening in said housing;
    (e) linkage means coupled to said first and second pairs of centering fingers for:
        (i) effecting movement of said first pair of centering fingers toward and into engagement with a circuit component held on said pick-up means to center said component on said pick-up means in said first direction and, thereafter, retract said first pair of centering fingers away from said component: and, simultaneously with the retraction of said first pair of centering fingers,
        (ii) effecting movement of said second pair of centering fingers toward and into engagement with said component to center said component on said pick-up means in said second direction and, thereafter, retract said second pair of centering fingers from said component; and,
    (f) a rotary stepper motor mounted on said housing and coupled to said linkage means for:
        (i) upon rotation of said motor in a first direction, effecting movement of said first pair of opposed centering fingers into engagement with said component;
        (ii) upon rotation of said motor in the reverse rotary direction to said first rotary direction, effecting movement of said first pair of opposed centering fingers away from said component and simultaneous movement of said second pair of opposed centering fingers toward and into engagement with said component, whereby said component will be centered with respect to said nozzle in said first and second directions; and
        (iii) upon rotation of said motor in said first rotary direction a second time, effecting movement of said second pair of opposed centering fingers away from engagement with said component.

20. A robotics systems according to claim 19 wherein said rotary stepper motor effects movements of said first and second pairs of centering fingers with controlled deceleration as each finger of each pair of centering fingers approach said component so that each pair of centering fingers will engage said component with low impact force.

* * * * *

UNITED STATES PATENT AND TRADEMARK OFFICE
CERTIFICATE OF CORRECTION

PATENT NO. : 4,987,676

DATED : January 29, 1991

INVENTOR(S) : Vincent G. Amorosi

It is certified that error appears in the above-identified patent and that said Letters Patent is hereby corrected as shown below:

Column 1, line 13, delete "10";
Column 4, line 5, after "of FIG." insert -- 1; --;
Column 5, line 1, delete "15";
Column 5, line 2, delete "66" and substitute therefore -- 56 --;
Column 5, line 18, delete "so" and substitute therefore -- 80 --;
Column 6, line 52, delete "90" and substitute therefore -- 90° --;
Column 9, line 20, delete "26" and substitute therefore -- 126 --;
Column 9, line 21, delete "26" and substitute therefore -- 126 --;
Column 10, line 36, delete "Is" and substitute therefore -- 18 --;
Column 10, line 61, after "full step" insert -- . --;
Column 13, line 47, delete "i" and substitute therefore -- in --;
Column 13, line 48, delete "5";
Column 14, line 31, delete "15";
Column 14, line 35, delete "firs" and substitute therefore -- first --;
Column 14, line 45, delete "o" and substitute therefore -- of --;
Column 14, line 56, delete "are" and substitute therefore -- arm --.

Signed and Sealed this

Seventh Day of July, 1992

Attest:

DOUGLAS B. COMER

*Attesting Officer*   *Acting Commissioner of Patents and Trademarks*